(12) United States Patent
Hirano et al.

(10) Patent No.: US 11,101,000 B2
(45) Date of Patent: Aug. 24, 2021

(54) SEMICONDUCTOR DEVICE AND METHOD FOR OPERATING THE SAME

(71) Applicant: TowerJazz Panasonic Semiconductor Co., Ltd., Uozu (JP)

(72) Inventors: Hiroshige Hirano, Nara (JP); Hiroaki Kuriyama, Toyama (JP)

(73) Assignee: Tower Partners Semiconductor Co., LTD., Toyama (JP)

( * ) Notice: Subject to any disclaimer, the term of this patent is extended or adjusted under 35 U.S.C. 154(b) by 0 days.

(21) Appl. No.: 16/905,742

(22) Filed: Jun. 18, 2020

(65) Prior Publication Data

US 2020/0321057 A1    Oct. 8, 2020

Related U.S. Application Data

(63) Continuation of application No. PCT/JP2018/046524, filed on Dec. 18, 2018.

(30) Foreign Application Priority Data

Dec. 20, 2017 (JP) .............................. JP2017-243959
Jul. 31, 2018 (JP) .............................. JP2018-143871

(51) Int. Cl.
*G11C 16/14* (2006.01)
*G11C 16/04* (2006.01)
*H01L 27/11546* (2017.01)
*H01L 27/11553* (2017.01)

(52) U.S. Cl.
CPC .............. *G11C 16/14* (2013.01); *G11C 16/04* (2013.01); *H01L 27/11546* (2013.01); *H01L 27/11553* (2013.01)

(58) Field of Classification Search
CPC ... G11C 16/14; G11C 16/04; H01L 27/11546; H01L 27/11553; H01L 29/7885; H01L 27/11558; H01L 21/76
USPC ......................................... 365/185.01, 185.24
See application file for complete search history.

(56) References Cited

U.S. PATENT DOCUMENTS

| | | | | |
|---|---|---|---|---|
| 4,982,377 A | * | 1/1991 | Iwasa ................ | G11C 16/0441 257/316 |
| 5,412,599 A | * | 5/1995 | Daniele ............. | H03K 17/6235 326/112 |
| 5,668,757 A | * | 9/1997 | Jeng .................. | G11C 16/0425 365/185.1 |

(Continued)

FOREIGN PATENT DOCUMENTS

| JP | 2003-332475 A | 11/2003 |
|---|---|---|
| JP | 2009-267185 A | 11/2009 |

(Continued)

*Primary Examiner* — Michael T Tran
(74) *Attorney, Agent, or Firm* — Knobbe, Martens, Olson & Bear LLP

(57) ABSTRACT

A semiconductor device includes a memory cell formed on a semiconductor substrate. The memory cell includes a first source region and a first drain region that are formed in the semiconductor substrate and a first selection gate, and a first floating gate disposed in series between the first source region and the first drain region. A first floating gate transistor including the first drain region and the first floating gate has a threshold set lower than a threshold of a first selection gate transistor including the first source region and the first selection gate.

18 Claims, 17 Drawing Sheets

(56) References Cited

U.S. PATENT DOCUMENTS

| | | | |
|---|---|---|---|
| 5,859,455 A * | 1/1999 | Yu | G11C 16/0425 257/315 |
| 8,378,407 B2 * | 2/2013 | Audzeyeu | G11C 16/0441 257/315 |
| 9,711,516 B2 * | 7/2017 | Chen | G11C 16/0433 |
| 10,535,409 B2 * | 1/2020 | Heinrich-Barna | G11C 16/10 |
| 2001/0004325 A1 * | 6/2001 | Choi | H01L 29/42328 365/185.14 |
| 2003/0235082 A1 | 12/2003 | Hsu et al. | |
| 2004/0057265 A1 * | 3/2004 | Mirabel | G11C 16/14 365/45 |
| 2005/0017287 A1 * | 1/2005 | Chih | G11C 16/0433 257/314 |
| 2005/0047213 A1 * | 3/2005 | Umezawa | G11C 16/08 365/185.28 |
| 2005/0218460 A1 * | 10/2005 | Hasegawa | G11C 16/20 257/390 |
| 2006/0023503 A1 * | 2/2006 | Lee | G11C 14/00 365/185.05 |
| 2015/0023105 A1 * | 1/2015 | Widjaja | G11C 11/404 365/185.18 |
| 2015/0187782 A1 | 7/2015 | Yamakoshi et al. | |
| 2015/0311219 A1 | 10/2015 | Taniguchi et al. | |
| 2016/0012894 A1 | 1/2016 | Lai et al. | |
| 2016/0013193 A1 | 1/2016 | Wu et al. | |
| 2016/0013199 A1 | 1/2016 | Hsu et al. | |
| 2016/0013776 A1 | 1/2016 | Huang | |
| 2016/0043132 A1 * | 2/2016 | Ihara | H01L 27/14603 257/291 |
| 2016/0071854 A1 * | 3/2016 | Hsu | H01L 29/66825 365/185.18 |
| 2016/0071858 A1 | 3/2016 | Yamakoshi et al. | |
| 2017/0059517 A1 * | 3/2017 | Bustillo | H01L 29/42324 |
| 2017/0236836 A1 * | 8/2017 | Huo | H01L 28/00 257/324 |
| 2019/0013199 A1 | 1/2019 | Bhargava et al. | |
| 2020/0119030 A1 * | 4/2020 | Dasgupta | H01L 21/0254 |

FOREIGN PATENT DOCUMENTS

| | | |
|---|---|---|
| JP | 2014-107406 A | 6/2014 |
| JP | 2015-128083 A | 7/2015 |
| JP | 2016-018992 A | 2/2016 |

\* cited by examiner

図21

SEMICONDUCTOR DEVICE AND METHOD FOR OPERATING THE SAME

CROSS-REFERENCE TO RELATED APPLICATION

This is a continuation of International Application No. PCT/JP2018/046524 filed on Dec. 18, 2018, which claims priority to Japanese Patent Application No. 2017-243959 filed on Dec. 20, 2017 and Japanese Patent Application No. 2018-143871 filed on Jul. 31, 2018. The entire disclosures of these applications are incorporated by reference herein.

BACKGROUND

Semiconductor memory devices have been used in various electronic devices and thus have become more common. For example, non-volatile memories (NVM) are widely used for mobile devices or the like (see, for example, Japanese Unexamined Patent Publication No. 2003-332475).

In general, NVMs are classified into multi-time programmable (MTP) memories and one-time programmable (OTP) memories. The MTP memories are memories from which data can be read multiple times and on which data can be written multiple times. While an erasing operation is not needed in the OTP memories, an erasing operation is needed in the MTP memories.

There are types of NVMs. As one type of NVMs, single poly NVMs which enable reduction of additional fabrication process steps have been proposed. In a single poly NVM, an electric charge storage floating gate having a polysilicon single layer is formed. The single poly NVM is compatible with a normal CMOS process, and therefore, is applied as an embedded memory into a microcontroller or the like (see, for example, Japanese Unexamined Patent Publication No. 2016-18992).

SUMMARY

In NVMs, there are demands for efficiently performing rewriting including an erasing operation. For example, reduction in voltage, time, or the like in an erasing operation and a write operation is required. There are also demands for reducing an area of a memory cell. Therefore, in the present disclosure, for a semiconductor device, a technology that realizes at least one of increase in operation efficiency and reduction in area of a memory cell will be described.

A semiconductor device according to the present disclosure includes a memory cell formed on a semiconductor substrate. The memory cell includes a first source region and a first drain region that are formed in the semiconductor substrate and a first selection gate and a first floating gate disposed in series between the first source region and the first drain region. A first floating gate transistor including the first drain region and the first floating gate has a threshold set lower than a threshold of a first selection gate transistor including the first source region and the first selection gate.

According to the above described semiconductor device, an erasing operation and a write operation can be efficiently performed.

Note that the semiconductor device may further include a first element including a first region and a first gate portion each corresponding to an associated one of a source and a drain that are formed in the semiconductor substrate, each of the first selection gate transistor and the first floating gate transistor may be an N-channel type transistor, and the first gate portion may be electrically coupled to the first floating gate.

Thus, an MTP memory is realized.

The threshold of the first floating gate transistor may be lowered by applying a zero voltage or a negative voltage to the first drain region and lowering a potential level of the first floating gate.

Thus, the erasing operation can be efficiently performed.

The semiconductor device may further include a second element including a second region and a second gate portion each corresponding to an associated one of a source and a drain that are formed in the semiconductor substrate, and the second gate portion may be electrically coupled to the first floating gate.

Furthermore, the second gate portion may be larger than first gate portion, the threshold of the first floating gate transistor may be lowered by applying a positive voltage to the first region and extracting electric charge of the first floating gate, and the threshold of the first floating gate transistor may be raised due to hot carriers by applying a positive voltage to the first drain region and applying a positive voltage to the second region.

Thus, the erasing operation and the write operation can be efficiently performed.

The semiconductor device may further include a second drain region formed on the semiconductor substrate and a second floating gate disposed between the second drain region and the first selection gate, a second floating gate transistor including the second drain region and the second floating gate may be formed, and the first floating gate and the second floating gate may be electrically coupled to each other.

The semiconductor device may further include a second drain region formed on the semiconductor substrate and a second floating gate and a second selection gate disposed in series between the second drain region and the first source region, a second floating gate transistor including the second drain region and the second floating gate and a second selection gate transistor including the first source region and the second selection gate may be formed, and the first floating gate and the second floating gate may be electrically coupled to each other.

Thus, the erasing operation after the write operation can be efficiently performed.

Moreover, the first floating gate may have a planner shape with a recessed portion in an edge portion located in a side closer to the first drain region.

Thus, a coupling capacity can be increased, and thus, the write operation can be efficiently performed.

According to the semiconductor device of the present disclosure, at least one of increase in the operation efficiency of the erasing operation, the write operation, or the like, and reduction in the area of the memory cell can be realized.

DETAILED DESCRIPTION

Embodiments of the present disclosure will be described below with reference to the accompanying drawings. Note that technical contents of the present disclosure are not limited to the following embodiments and can be modified as appropriate without departing from the scope in which effects of the present disclosure are achieved.

First Embodiment

Figure 1:
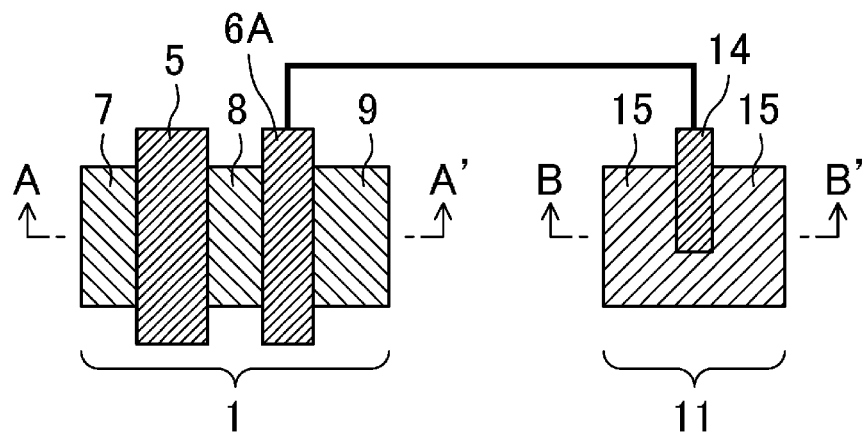
FIG. 1 is a plan view schematically illustrating configurations of a memory cell and another transistor for a semiconductor device of a first embodiment.
Figure 2:
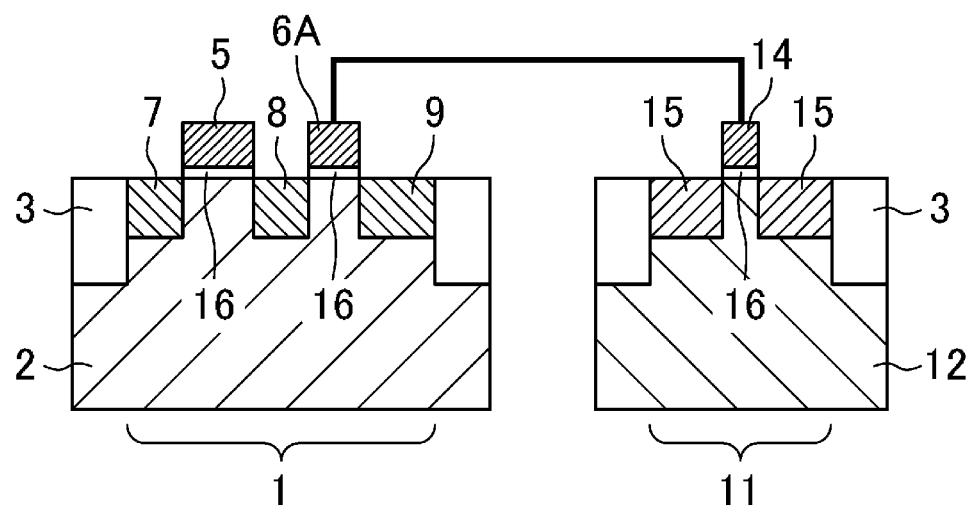
FIG. 2 is a cross-sectional view illustrating cross sections taken along the line A-A' and the line B-B' of FIG. 1.

FIG. 1 is a plan view schematically illustrating a layout for a semiconductor memory device of a first embodiment of the present disclosure. FIG. 2 is a cross-sectional view schematically illustrating cross sections taken along the line A-A' and the line B-B' of FIG. 1.

The semiconductor memory device of this embodiment includes a first active region 1, as a memory cell, including a read section and a write section and a second active region 11. As for the memory cell, a memory cell that includes a read section and a write section but does not include an erasing section is an OTP memory, and a memory cell that includes an erasing section is an MTP memory.

In the first active region 1, the memory cell is formed using a P-type well 2 that is a semiconductor substrate. A selection gate 5 and a floating gate 6A are formed on the P-type well 2 divided by an isolation region 3 with a gate insulation film 16 interposed therebetween. A source region 7 is formed in a part of an upper portion of the P-type well 2 located in an opposite side to the floating gate 6A with respect to the selection gate 5. A diffused connection region 8 is formed in a part of the upper portion of the P-type well 2 located between the selection gate 5 and the floating gate 6A. A drain region 9 is formed in a part of the upper portion of the P-type well 2 located in an opposite side to the selection gate 5 with respective to the floating gate 6A. Thus, a configuration in which the N-channel type selection gate 5 and the floating gate 6A are disposed in series in the P-type well 2 is achieved.

In the memory cell, a selection gate transistor including the source region 7, the diffused connection region 8, the selection gate 5 is formed. A floating gate transistor including the diffused connection region 8, the drain region 9, and the floating gate 6A is also formed.

In this case, a width of the floating gate 6A (that is, a dimension in a lateral direction in each of FIG. 1 and FIG. 2) is set narrower than a width of the selection gate 5. Accordingly, a channel length of the floating gate 6A is shorter than a channel length of the selection gate 5 so that a threshold is reduced. Thus, an erasing operation in which the floating gate transistor is in an on state can be easily performed. When performing a write operation, because the channel length is short, a current easily flows, hot carriers tend to be generated, and therefore, an advantageous effect that a write operation can be easily performed is achieved.

In the second active region 11, a gate 14 is formed on an N-type well 12 divided by the isolation region 3 with the gate insulation film 16 interposed therebetween. An impurity region 15 that is a source region or a drain region is formed in a part of the upper portion of the N-type well 12 located around the gate 14. The floating gate 6A and the gate 14 are electrically coupled to each other.

Although illustration is omitted, a contact used for applying a predetermined voltage to the impurity region 15 is provided.

Figure 3:
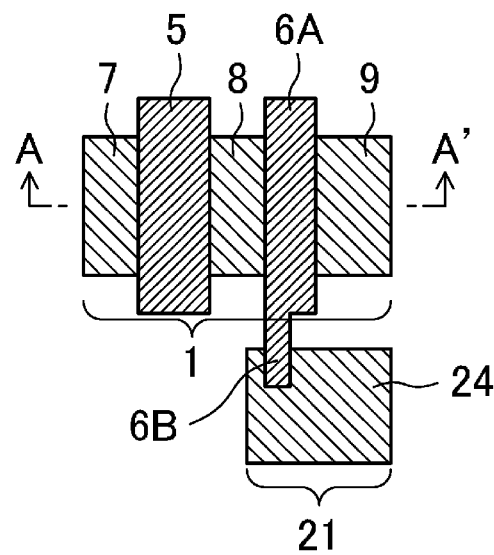
FIG. 3 is a plan view illustrating a layout of a memory cell including an erasing section.

Next, FIG. 3 illustrates an example of a layout including an element 21 as an erasing section for the memory cell. In FIG. 3, the element 21 has a similar configuration to that of the active region 11 illustrated in FIG. 1 and FIG. 2. The memory cell of the active region 1 has a similar configuration to that illustrated in FIG. 1 and FIG. 2. Therefore, a floating gate 6B is disposed on a source 24 of the element 21 and a contact (not illustrated) used for applying a voltage to the source 24 is provided therein.

However, the floating gate 6A is extended (downwardly in FIG. 3) to reach a portion of the element 21 and an extended portion of the floating gate 6A serves as a floating gate 6B.

The floating gate 6B has a smaller width than the width of the floating gate 6A. A length of a portion (which will be referred to as a floating gate 6A region) in which the floating gate 6B is located above an N well of the element 21 is shorter than a length of a portion (which will be referred to as a floating gate 6B region) in which the floating gate 6A is located above the P-type well 2. Therefore, an area of the floating gate 6B region is smaller than an area of the floating gate 6A region. The above described dimensions are set in order to increase a voltage applied between each of the floating gates 6A and 6B and the source 24 when an erasing operation which will be described later is performed such that the erasing operation is easily performed. When the area of the floating gate 6A is large, a capacity is large, so that a potential is stabilized. As a result, fluctuation of the potential due to coupling when a voltage is applied to a source 24 region is reduced. Based on this, the areas of the floating gates 6A and 6B are set in order to set a voltage applied between each of the floating gates 6A and 6B and the source 24 to be a desired value.

Figure 4:
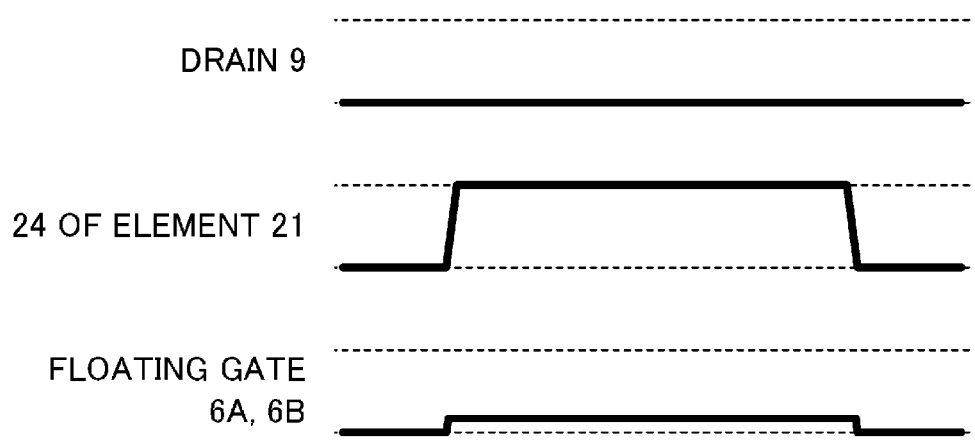
FIG. 4 is a chart illustrating an erasing operation in the semiconductor device of the first embodiment.

An erasing operation of the above described memory cell will be described in detail with reference to an operation timing chart of FIG. 4. When performing the erasing operation, a voltage of the drain region 9 is set to a ground voltage and a high voltage is applied to the source region 24 of the element 21. In this state, electric charge is extracted from the floating gate 6B to the source region 24 due to a Fowler-Nordheim (FN) tunnel current, thereby performing the erasing operation.

In this case, the floating gate 6A region is larger than the floating gate 6B region, and therefore, in each of the floating gates, a potential is fixed by the drain region 9 or the like and hardly fluctuates. As a result, the voltage applied to the source region 24 is reliably applied to the floating gate 6A region and erasing is performed. Note that, although the voltage applied to the source 24 region is set based on a thickness of a gate oxide film of a transistor or the like, for example, the voltage is about 10 to 12 V when the gate oxide has a thickness of about 10 to 13 nm.

A read operation is determined, for example, based on a current flowing when a voltage of about 1 V is applied to the drain. An amount of a current flowing during reading is set small such that a write operation (write disturbance) due to hot carriers is not caused.

Note that, although, in the above described erasing operation, the element 21 as the erasing section is used, it is also possible to perform an erasing operation by setting the voltage of the drain region 9 to a high voltage. In this case, it is preferable to form the floating gate 6B region larger than the floating gate 6A region such that the source region 24 is fixed to, for example, the ground voltage. Thus, when a voltage is applied to the drain region 9, the potentials of the floating gates are fixed and hardly fluctuate. In addition, the floating gate 6B region is made into a depletion type, and thus, it is possible to achieve further stability. In this configuration, because the floating gate 6B region is large, in a third modified example of the first embodiment which will be described later, an advantageous effect of application of a high voltage to the source region 24 used for reduction in a write operation can be achieved.

First Modified Example of First Embodiment

Figure 5:
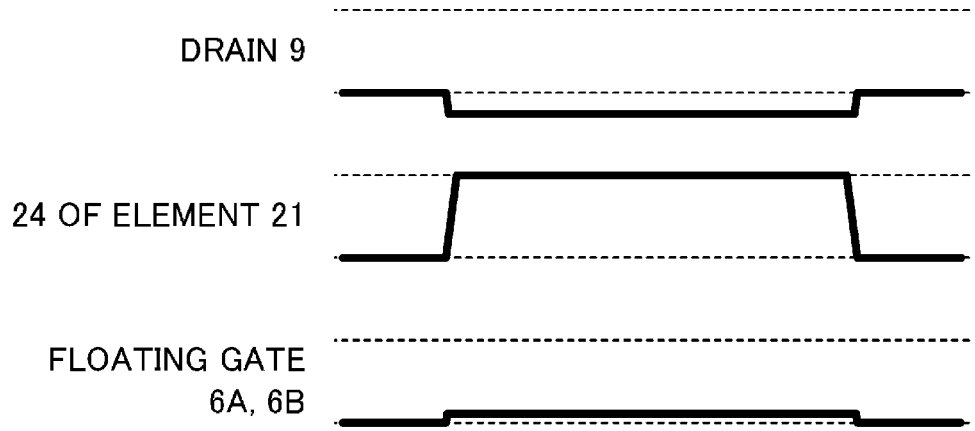
FIG. 5 is a chart illustrating an erasing operation of a semiconductor device of a first modified example of the first embodiment.

A first modified example of the first embodiment will be descried in detail with reference to an operation timing chart of FIG. 5. This modified example is related to an erasing operation. When performing the erasing operation, the voltage of the drain region 9 is set to be in a state in which the ground voltage (0 V) or a negative voltage is applied, and a high voltage is applied to the source region 24 of the element 21. When the voltage of the drain region 9 is equal to or lower than a built-in voltage between the drain region 9 and the substrate 2, a current flows, and therefore, it is difficult to set the voltage of the drain region 9 to a lower voltage than the built-in voltage. In contrast, by applying a negative voltage to the drain region 9 after applying a high voltage to the source region 24, a higher voltage difference can be applied to the source region of the element 21. By applying a negative voltage to the drain region 9 in the above described manner, a potential difference between the floating gate 6B and the source region 24 is increased and the erasing operation can be more easily performed.

When performing a write operation, the source region 24 is set to the ground voltage and a high voltage is applied to the drain region 9. Thus, a potential of the floating gate 6A is raised, a current flows, and thus, hot carriers are generated, so that electric charge is stored in the floating gate 6A. As a result, a threshold of the floating gate 6A is increased and a write operation is performed. In order to increase writing speed, it is effective to cause a large amount of a current to flow, and therefore, it is desired to increase the voltage of the drain region 9.

Note that, similar to the first embodiment, the erasing operation can be performed by setting the voltage of the drain region 9 to a high voltage. In this case, erasing can be more easily performed by applying a negative voltage to the source region 24 of the element 21.

Second Modified Example of First Embodiment

Figure 6:
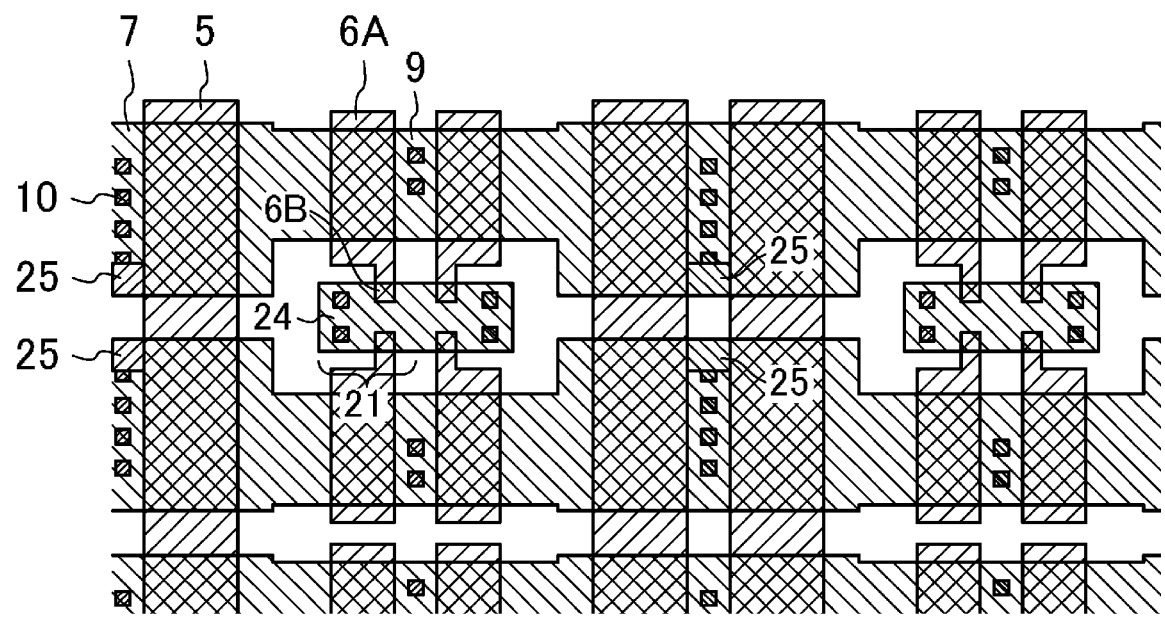
FIG. 6 is a view illustrating a memory array of a semiconductor device of a second modified example of the first embodiment.

As a second modified example of the first embodiment, a configuration example of a memory array is illustrated in FIG. 6. In this configuration example, elements 21 of erasing sections of four memory cells are put together in one position. Due to this configuration, an area of the memory array can be reduced.

Note that, in FIG. 6, contacts 10 provided for the source region 7, the drain region 9, the source region 24 of the element 21, or the like are illustrated.

When the memory array is large, a potential contact for the substrate (the P-type well in this case) is provided only around the memory array and thus connection is ensured, and therefore, a substrate potential tends to float. Therefore, in the configuration example of FIG. 6, a substrate contact region 25 is set in a part of a source portion such that the substrate potential can be provided for each memory cell. Specifically, a substrate contact is provided by injecting p-type impurities. Thus, floating of the substrate potential can be suppressed and a stable operation can be performed.

Third Modified Example of First Embodiment

Figure 7:
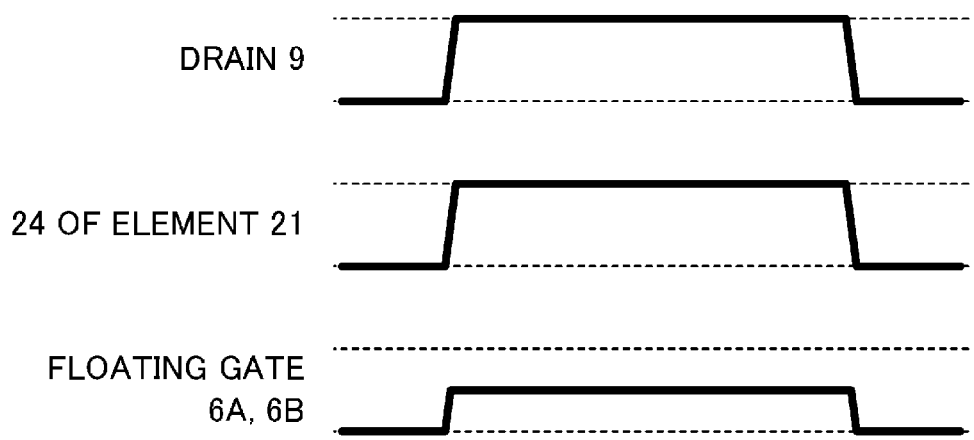
FIG. 7 is a chart illustrating a write operation of a semiconductor device of a third modified example of the first embodiment.

As the third modified example of the first embodiment, an improvement example of a write operation will be described with reference to a timing chart of FIG. 7.

In this write operation, the voltage of the source region 24 is set to a high voltage, a high voltage is applied to the drain region 9, and thus, the potential of the floating gate 6A is further raised. Thus, a larger amount of a current flows, more hot carriers are generated, electric charge is more efficiently stored in the floating gate 6A, and thus, a threshold can be set high in a short time.

When performing a read operation, a leakage current after writing can be reduced during reading by not applying a voltage to the drain region 9, so that a margin of a write operation can be ensured and a write time can be reduced.

In this case, for which is more efficient applying a high voltage to the drain region 9 first and applying a high voltage to the source region 24 first, an optimal condition can be understood based on a relationship of a ratio between a capacity of a channel portion of the floating gate 6A and a capacity of a floating gate 6B portion. In a case where a high voltage is applied to the source region 24 first, when a voltage is too high, an erasing operation is performed, and therefore, a voltage that is to be applied is set to a proper voltage. For example, a gate oxide film of a transistor has a thickness of about 10 to 13 nm and, when the ratio between the capacities of floating gates 6A and 6B is about 20 times, as an example of a voltage that is to be applied to the source region 24, a voltage of about 10 V is applied. Note that a write assist operation from the source region 24 has an effect of largely improving the write time.

Note that, as for an erasing operation, there are cases where erasing for a plurality of memory cells is performed as a collective erasing operation. With the aim of reducing variations of characteristics of the memory cells after this erasing operation, a write operation can be performed on a memory cell on which writing has not been performed among the memory cells before the erasing operation. Thus, variations of erasing characteristics for the plurality of memory cells are reduced, so that an erasing time and a write time thereafter can be reduced.

As the write operation then, the above described operation method of the first modified example can be used. The write operation is performed before this erasing operation to reduce variations of the characteristics of the memory cells, and therefore, a sufficient writing is not needed to be performed. Therefore, as the voltage of the source region 24, a high voltage is not applied but, for example, the voltage of the source region 24 is set to the ground voltage. Thus, variations of the characteristics of the memory cells can be also reduced by performing a write operation under loose conditions. When this method is used, because writing is performed under loose conditions, the erasing time is not prolonged and a trap of hot carriers is reduced, so that the memory cells are less deteriorated.

Note that, in the above described erasing operation, the element 21 as the erasing section is used. In contrast, similar to the above description in the first embodiment, an erasing operation by setting the voltage of the drain region 9 to a high voltage can be performed.

Second Embodiment

Figure 8:
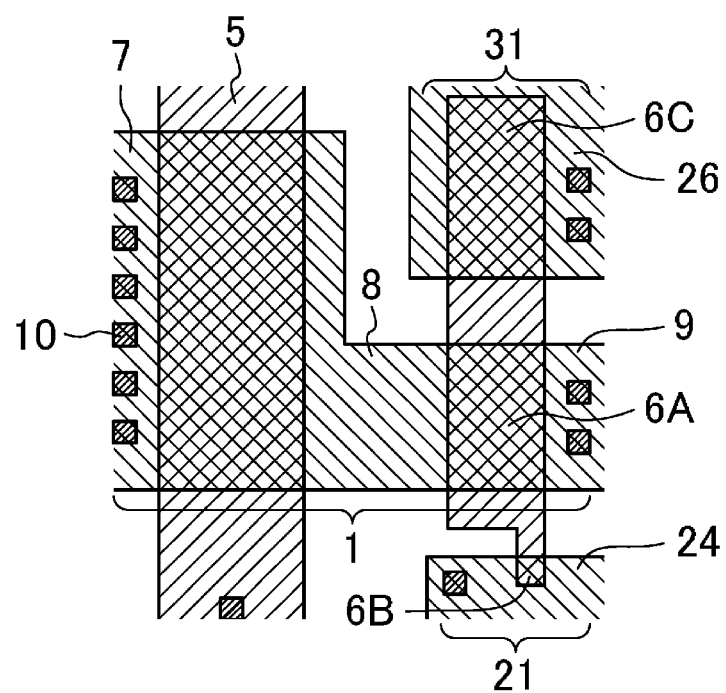
FIG. 8 is a plan view schematically illustrating configurations of a memory cell and another transistor for a semiconductor device of a second embodiment.

A second embodiment of the present disclosure will be described below. FIG. 8 is a plan view schematically illustrating a layout for a semiconductor memory device of this embodiment.

In the above described first embodiment, specifically, in the third modified example of the first embodiment, in addition to the erasing operation by the source region 24, the write assist operation using this region is performed. In contrast, according to this embodiment, in order to more effectively perform the write assist, a write assist region 31 (an element 31) and a source region 26 are formed separately from an erasing active ration 21 and a source region 24.

Specifically, the write assist region 31 includes the source region 26 provided on a semiconductor substrate and a floating gate 6C. The floating gate 6C is provided so as to be continuous with a floating gate 6A. The source region 26 of the write assist region 31 is isolated from the drain region 9, the diffused connection region 8, or the like. A contact used for applying a voltage to the source region 26 is also provided.

A region of the floating gate 6C is set to be larger than a region of the floating gate 6A. Thus, a write assist can be more effectively performed. When performing an erasing operation, floating of the floating gate 6A can be reduced, and therefore, an application voltage of the source region 24 can be more easily applied, so that erasing can be more efficiently performed.

Figure 9:
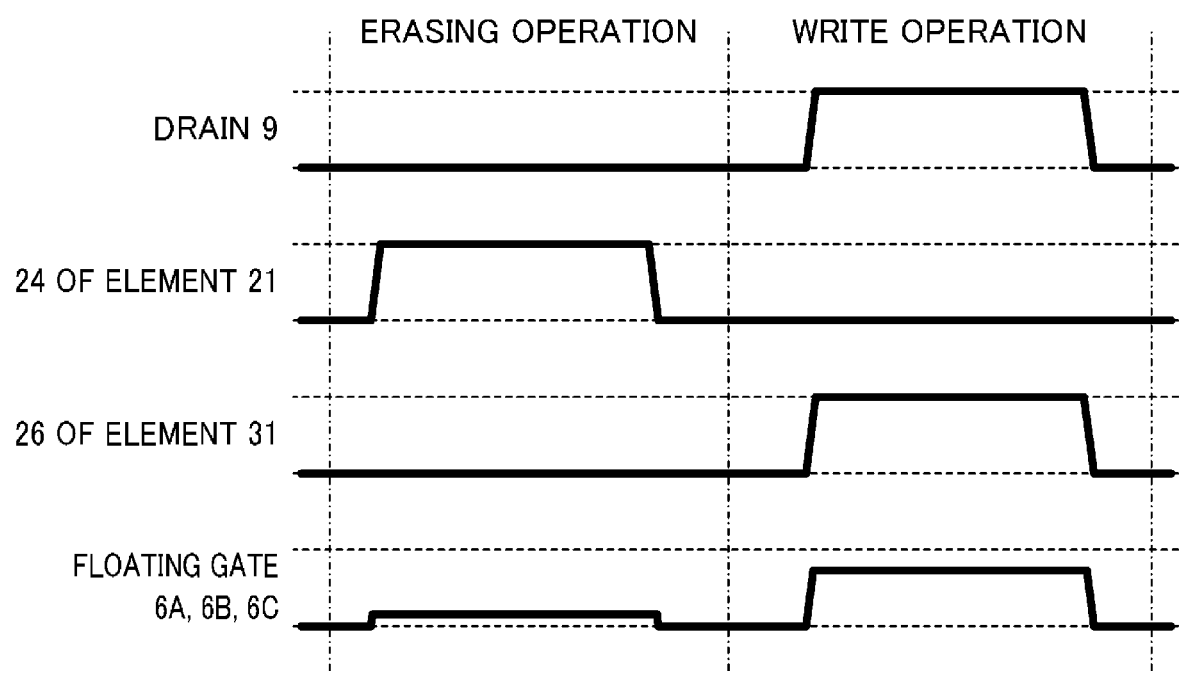
FIG. 9 is a chart illustrating erasing and write operations of the semiconductor device of the second embodiment.

FIG. 9 is a timing chart of an operation performed in a memory cell of this embodiment, and illustrates an erasing operation and a write operation.

When performing the erasing operation, the drain region 9 and the source region 26 of the element 31 are set to the ground voltage and a high voltage is applied to the source region 24 of an element 21. Thus, electric charge of the floating gate 6A is extracted due to an FN tunnel current and an erasing state is achieved. When performing the write operation, a voltage is applied to the drain region 9, a high voltage is also applied to the source region 26 of the element 31, and the source region 24 of the element 21 is set to the ground voltage or a high voltage. Thus, the potential of the floating gate 6A is raised to increase an amount of a current from the drain region 9, and the write operation is efficiently performed due to hot carriers generated by this current.

Figure 10:
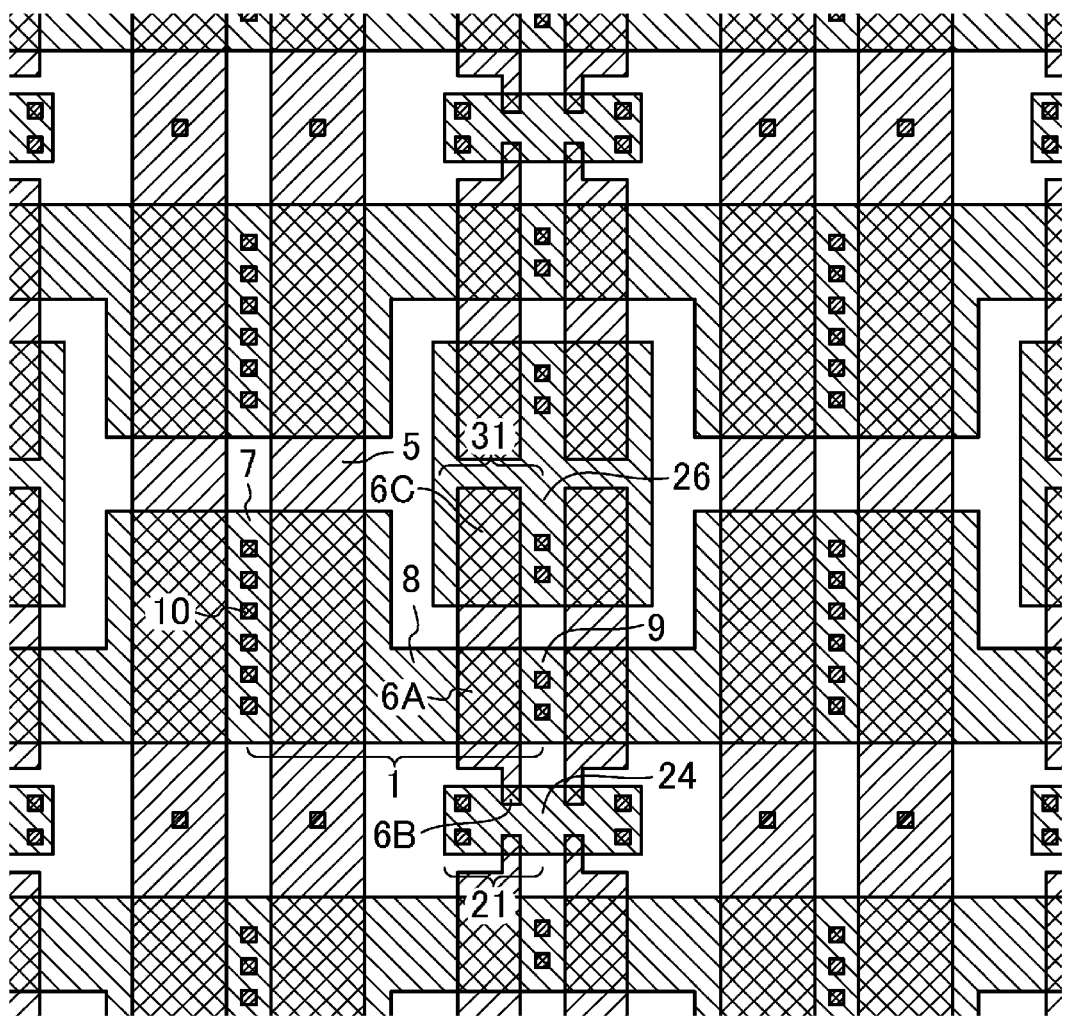
FIG. 10 is a view illustrating a memory array in the semiconductor device of the second embodiment.

A configuration example of a memory array using a memory cell according to this embodiment is illustrated in FIG. 10. In this configuration example, elements 21 of erasing sections of four memory cells are put together in one position and the write assist elements 26 of other four memory cells are put together in one position. With this configuration, an area of the memory array can be reduced. Also, a configuration in which, in terms of FIG. 10 illustrating this configuration example, a selection gate transistor is set large using a lateral portion of the region 24 as well to increase a current capacity without increasing a memory cell area can be also employed.

Note that, similar to the first embodiment, a substrate contact region can be set in a part of the source portion of each of the memory cells.

Third Embodiment

Figure 11:
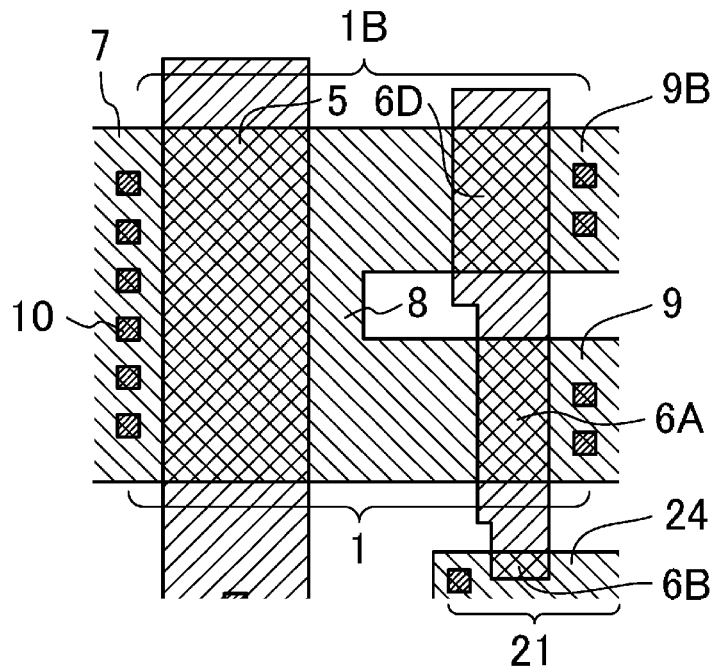
FIG. 11 is a plan view schematically illustrating configurations of a memory cell and another transistor for a semiconductor device of a third embodiment.

A third embodiment of the present disclosure will be described below. FIG. 11 is a plan view schematically illustrating a layout for a semiconductor memory device of this embodiment.

In the above described first embodiment, a configuration in which the same transistor is used for both of the write operation and the read operation is employed. In contrast, in this embodiment, a configuration in which a separate transistor is used for each of the write operation and the read operation is employed.

In the write operation, hot carriers reach a floating gate and are injected therein, thereby increasing a threshold. However, some of the hot carriers do not reach the floating gate and are trapped by a gate oxide film and an oxide film portion of a sidewall portion, or the like in some cases.

Specifically, as the write operation and the erasing operation are repeated, such trapped electric charge increases. As a result, the trapped electric charge cannot be extracted from an element 21 portion during the erasing operation. Furthermore, the same transistor is used also for the read operation, and therefore, it is needed to set an erased state by causing an over erased state in some cases. As described above, in order to eliminate the trapped electric charge, it is needed to cause an over erased state, and therefore, an erasing time is largely increased.

In contrast, in the configuration of this embodiment, a read transistor is set separately from a write transistor. Thus, it is enabled to reduce influences of trapped electric charge during reading. Accordingly, it is enabled to perform erasing without increasing the erasing time even after writing and erasing have been repeated. Specifically, this embodiment is effective in a memory that is required to perform rewriting many times. Furthermore, an independent transistor is separately provided for each of the write operation and the read operation, and thus, even when a channel length of the write transistor is shortened to increase the amount of a current in order to reduce the write time, it is no longer needed to care a leakage during reading and the write operation can be more efficiently performed.

Specifically, in a memory cell of this embodiment, a transistor including the drain region 9, the floating gate 6A, and the diffused connection region 8 is a write operation transistor. On the other hand, a transistor including a drain region 9B that is provided so as to be isolated from the drain region 9, a floating gate 6D, and the diffused connection region 8 is a read operation transistor. The floating gate 6A and the floating gate 6D are continuously provided. The floating gate 6A has a smaller width (dimension in the lateral direction in FIG. 11) than a width of the floating gate 6D, that is, the above described configuration in which the write operation transistor has a shorter channel length is employed.

Figure 12:
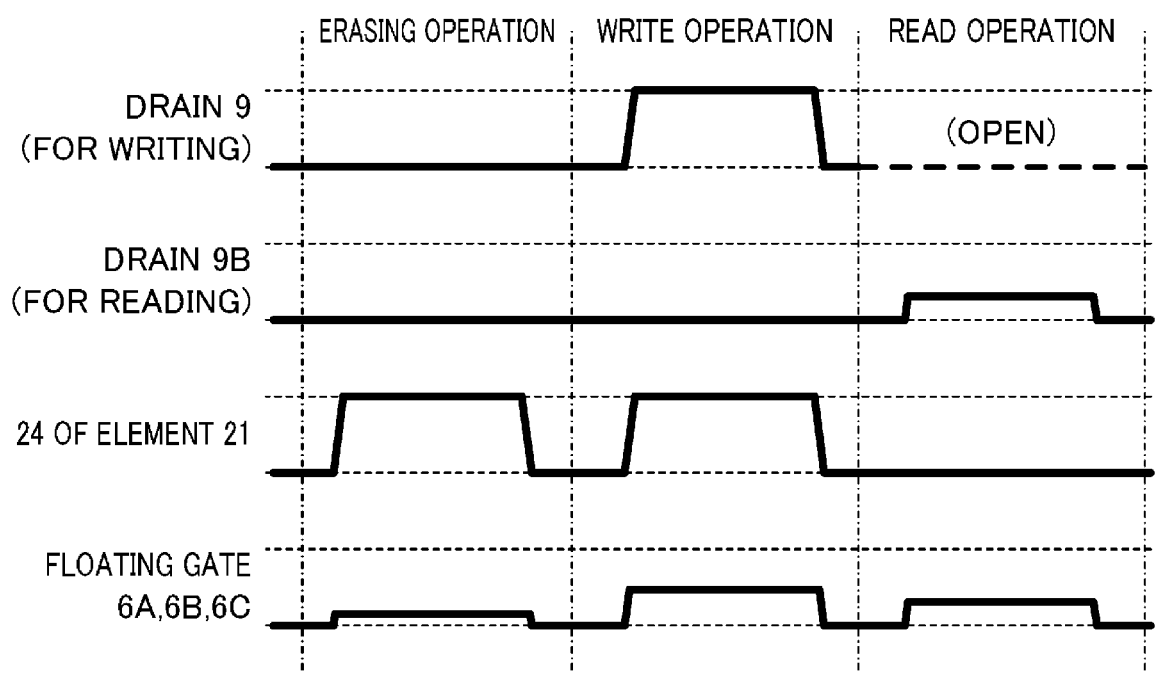
FIG. 12 is a chart illustrating an erasing operation, a write operation, and a read operation in the semiconductor device of the third embodiment.

Next, FIG. 12 is a timing chart of an operation performed in a memory cell of this embodiment and illustrates an erasing operation, a write operation, and a read operation.

When performing the erasing operation, the drain region 9 and the drain region 9B are set to the grand voltage and a high voltage is applied to the source region 24 of the element 21 used for the erasing operation. Thus, electric charge of the floating gates 6 is extracted by an FN tunnel current to cause an erasing state. When performing the write operation, a voltage is applied to the drain region 9, the drain region 9B is set to the ground voltage, a high voltage is applied as an assist to the source region 24 of the element 21, and thus, the write operation is performed. When performing the read operation, a voltage of about 1 V is applied to the drain 9B of the read operation transistor, and thus, read determination is perform using a current thereof. At this time, a write drain 9 is put in an open state.

Figure 13:
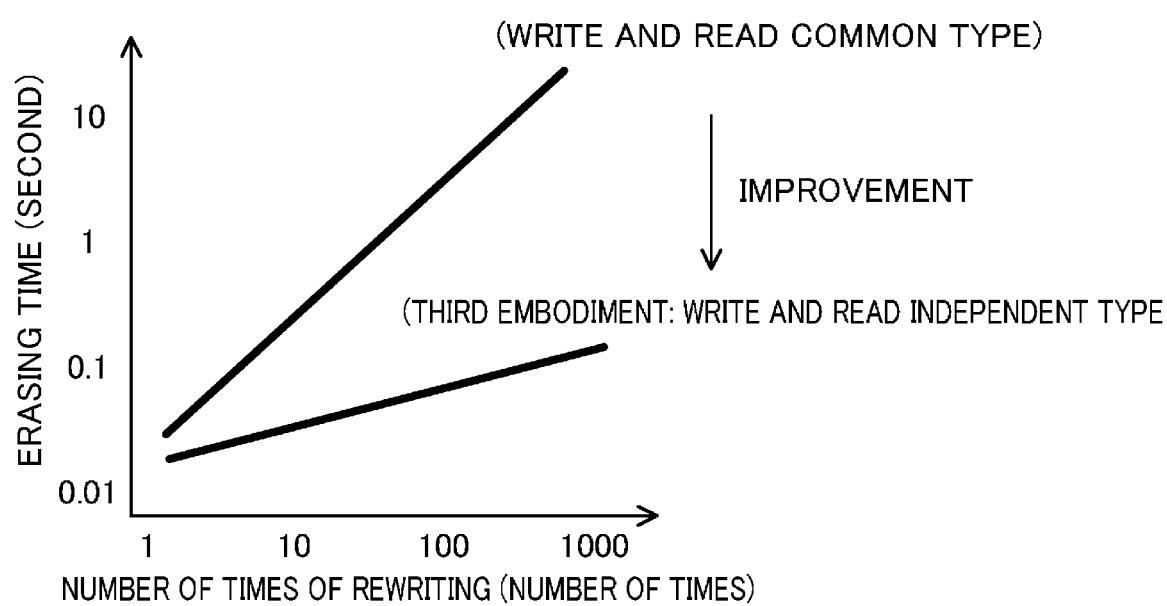
FIG. 13 is a graph illustrating a relationship between the number of times of rewriting and an erasing time in the semiconductor device of the third embodiment.

FIG. 13 is a graph illustrating an example of a relationship between the number of times of rewriting and the erasing time for a memory cell on which the write operation and the read operation are performed by a common transistor and a memory cell on which each of the write operation and the read operation is separately performed by a corresponding independent transistor. In contrast to the memory cell on which the write operation and the read operation are performed by the common transistor, in the memory cell on which each of the write operation and the read operation is separately performed by the corresponding independent transistor, the erasing time is largely improved and a large effect can be achieved.

Figure 14:
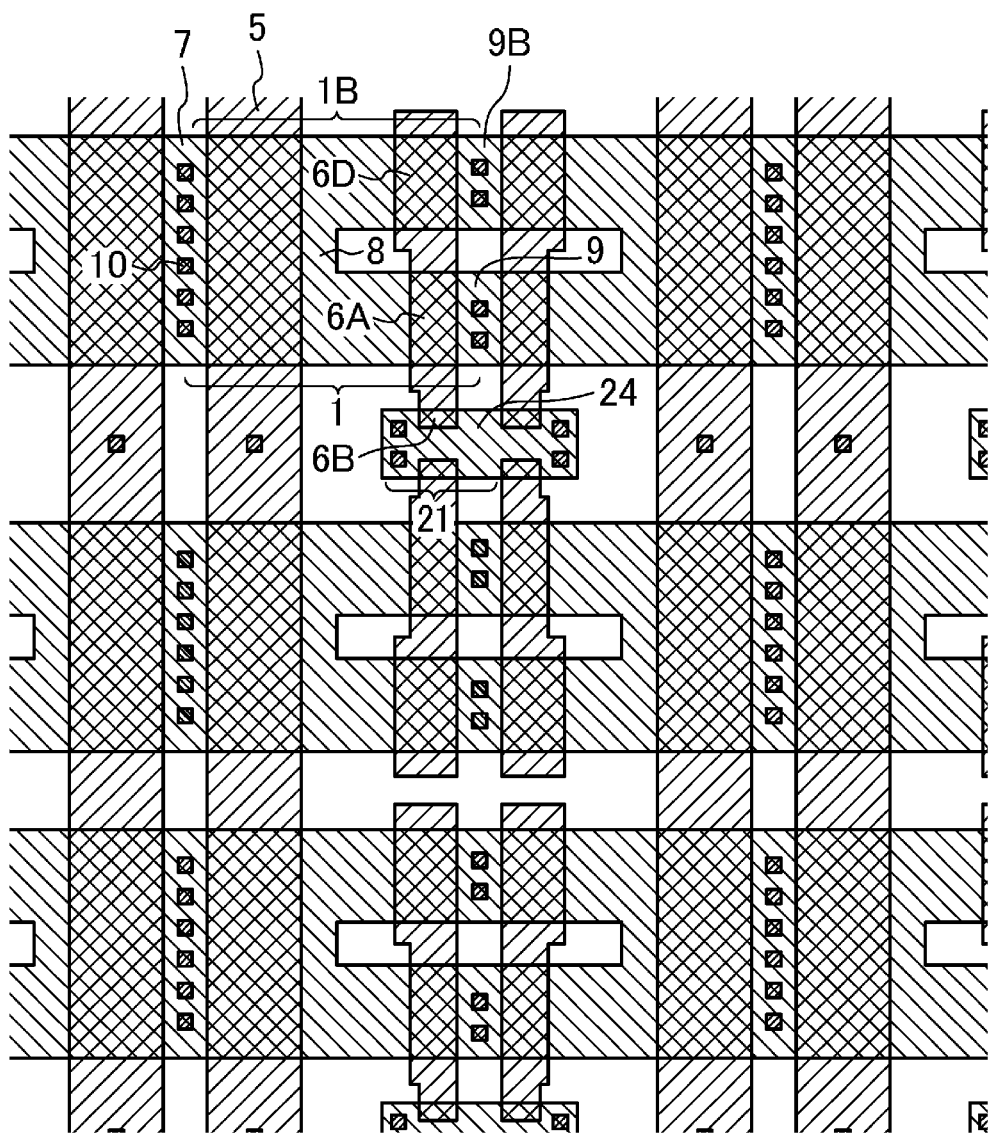
FIG. 14 is a view illustrating a memory array of the semiconductor device of the third embodiment.

A configuration example of a memory array using the memory cell of this embodiment is illustrated in FIG. 14. In this configuration example, elements 21 of erasing sections of four memory cells are put together in one position and an area of the memory array can be reduced. Also, similar to the first embodiment, a substrate contact region can be set in a part of the source portion of each of the memory cells.

Fourth Embodiment

Figure 15:
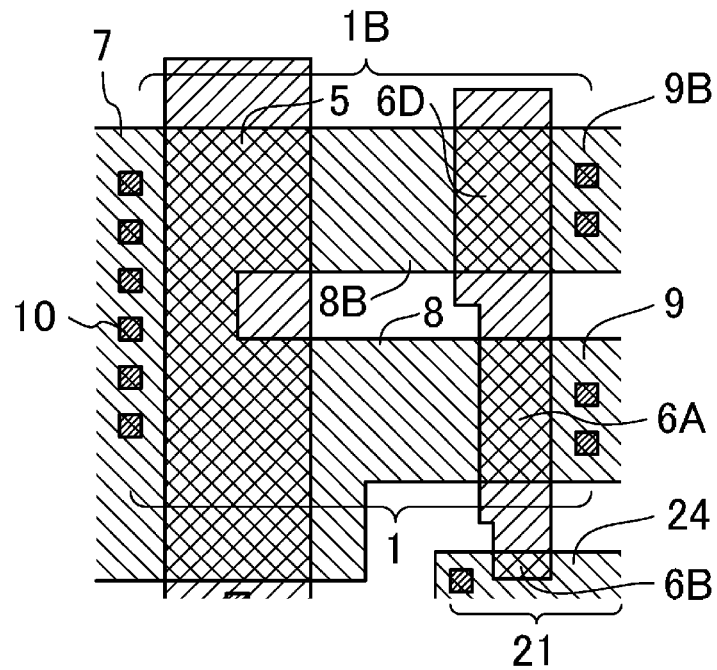
FIG. 15 is a plan view schematically illustrating configurations of a memory cell and another transistor for a semiconductor device of a fourth embodiment.

A fourth embodiment of the present disclosure will be described below. FIG. 15 is a plan view schematically illustrating a layout for a semiconductor memory device of this embodiment.

In the above described third embodiment, a configuration in which a separate transistor is used for each of the write operation and the read operation has been illustrated. In this embodiment, in addition to this, a selection transistor is independently set. Specifically, in the third embodiment illustrated in FIG. 11, for the read transistor including the floating gate 6D and the write transistor including the floating gate 6A, the common diffused connection region 8 is provided so as to serve as a source region of each of the read transistor and the write transistor. In contrast, in this embodiment illustrated in FIG. 15, a diffused connection region 8B is provided for a read transistor including a floating gate 6D, a diffused connection region 8 is provided for a write transistor including a floating gate 6A, and the diffused connection region 8B and the diffused connection region 8 are independent from each other.

According to this configuration, the write transistor for which a low threshold is set and the read transistor can be made completely independent from each other, respective drains thereof are made independent from each other accordingly, and therefore, a stable operation can be achieved without considering a leakage in the write transistor. Furthermore, the threshold of the write transistor can be set very low and an effect of reduction in the write time can be expected. In terms of isolation of the selection transistor, a configuration in which, even in a configuration (the configuration illustrated in FIG. 15) in which a portion of an active area which extends to a middle of a gate is isolated, there is no problem in operation can be employed.

Note that, in FIG. 15, the floating gate 6A and the floating gate 6D have the same channel length. However, similar to the third embodiment (FIG. 11), a configuration in which the write transistor has a longer channel length may be employed.

Figure 16:
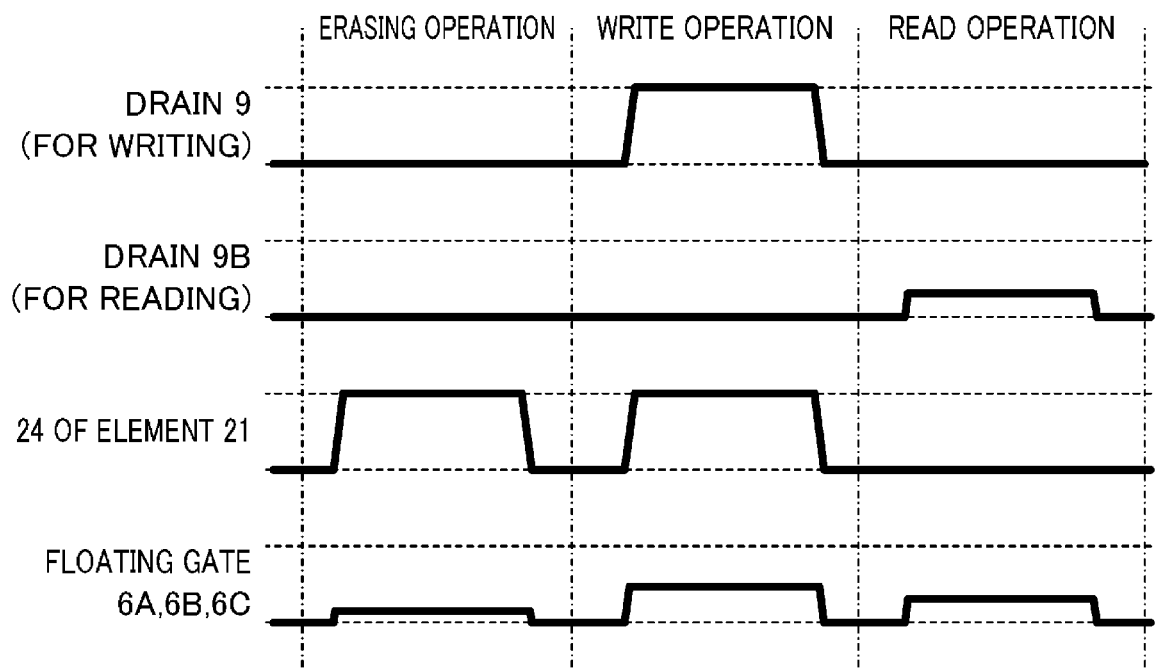
FIG. 16 is a chart illustrating an erasing operation, a write operation, and a read operation in the semiconductor device of the fourth embodiment.

Next, FIG. 16 is a timing chart of an operation performed in a memory cell of this embodiment and illustrates an erasing operation, a write operation, and a read operation. As an operation method, a similar method to that of the third embodiment is used. However, when performing the read operation, the read transistor can be grounded, instead of being put in an open state. This is an effect achieved by a configuration in which the write transistor and the read transistor are independent from each other.

Figure 17:
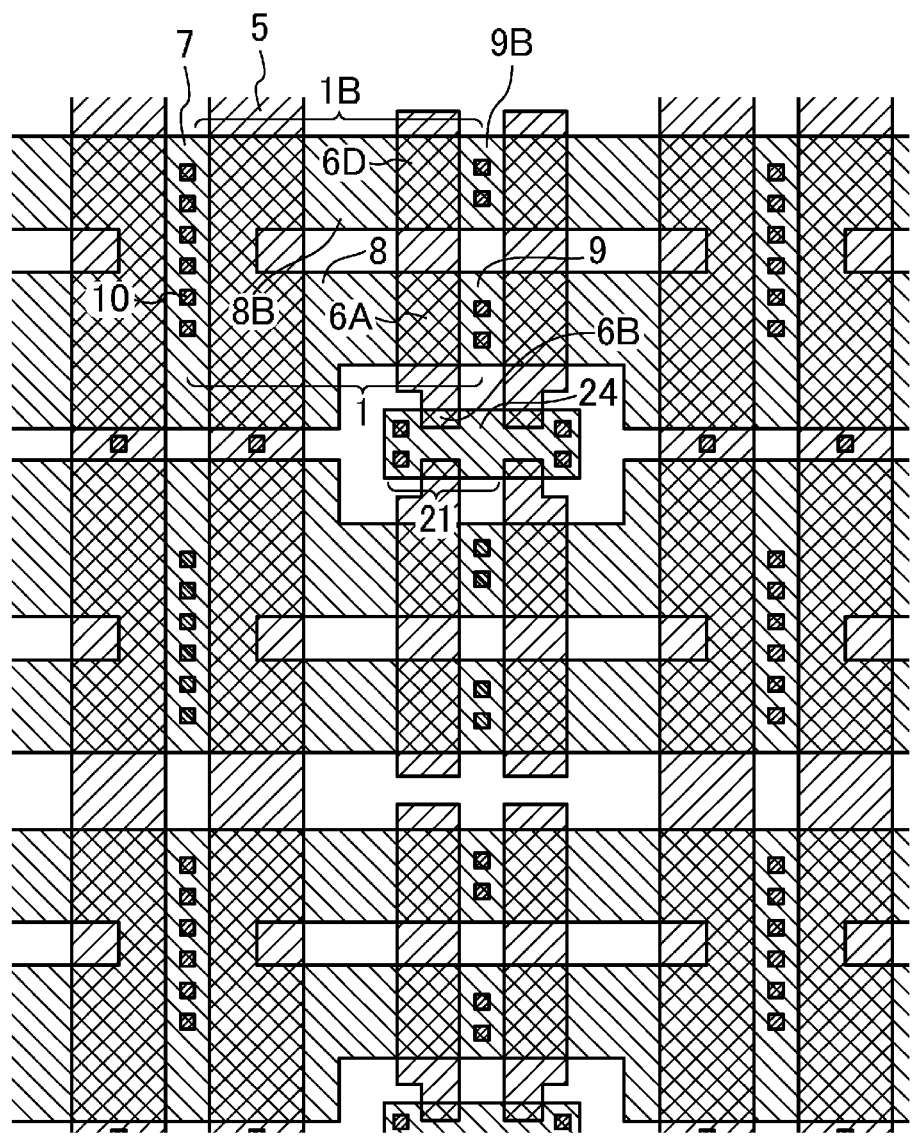
FIG. 17 is a view illustrating a memory array of the semiconductor device of the fourth embodiment.

A configuration example of a memory array of the memory cell of this embodiment is illustrated in FIG. 17. In this configuration example, elements 21 of erasing sections of four memory cells are put together in one position, and an area of the memory array can be reduced.

Fifth Embodiment

Figure 18:
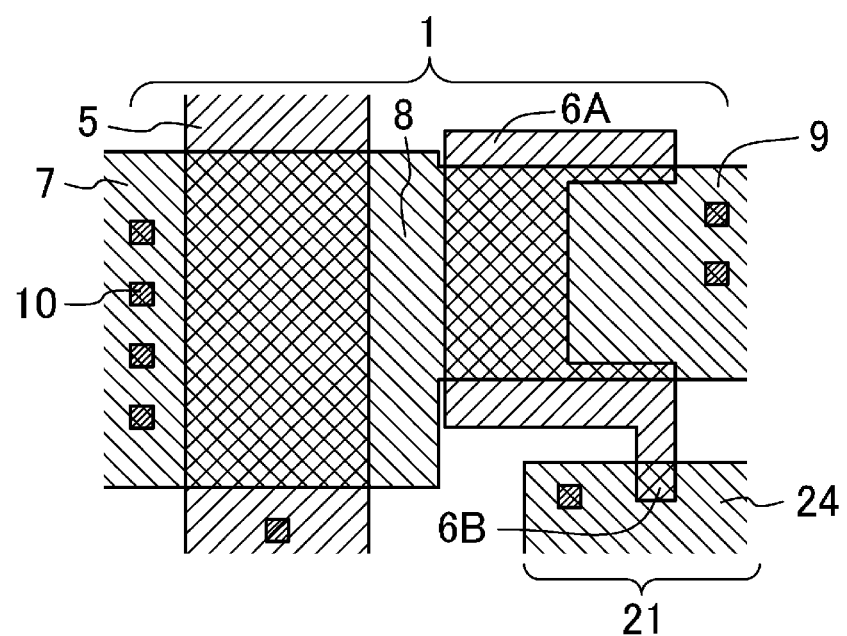
FIG. 18 is a plan view schematically illustrating configurations of a memory cell and another transistor for a semiconductor device of a fifth embodiment.

A fifth embodiment of the present disclosure will be described below. FIG. 18 is a plan view schematically illustrating a layout for a semiconductor memory device of the fifth embodiment of the present disclosure.

In this configuration example, in a configuration in which a common transistor is used for both of the write operation and the read operation, a planner shape of the floating gate 6A is modified. As a specific example, the floating gate 6A of FIG. 18 has a planner shape with a depression (a recessed portion) in a side closer to the drain region 9. Thus, as compared to a shape without a depression, a length of a gate side wall is increased and a fringe capacity is increased. As a result, when a high voltage is applied to the drain region 9 for a write operation, a larger coupling capacity can be achieved and the potential of the floating gate 6A can be raised to increase write efficiency. Note that, although the fringe capacity can be increased also by forming a protruding portion in the side close to the drain region 9, a gate oxide film capacity is increased as well in this case. Therefore, the planner shape of the floating gate 6A preferably has a portion with a recessed shape that can increase the fringe capacity while suppressing increase in the gate oxide film capacity.

Figure 19:
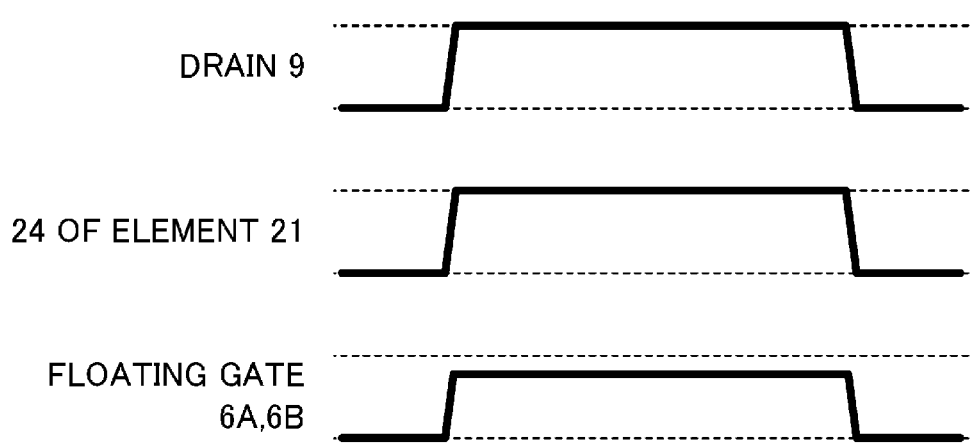
FIG. 19 is a chart illustrating a write operation of the semiconductor device of the fifth embodiment.

FIG. 19 is a timing chart of an operation performed in a memory cell of this embodiment and illustrates a write operation. An operation method is similar to that illustrated in FIG. 6, but the potential of the floating gate 6A is set higher.

As described above, a configuration in which the floating gate 6A has a depression can be set also in a transistor of another embodiment. In FIG. 18, a planner shape with one substantially rectangular shaped depression is illustrated. However, this shape is not essential and some other shape may be employed. In order to increase the gate side wall, for example, the floating gate 6A may have a shape with a plurality of substantially rectangular depressions, a shape with a stepped depression, or the like.

Figure 20:
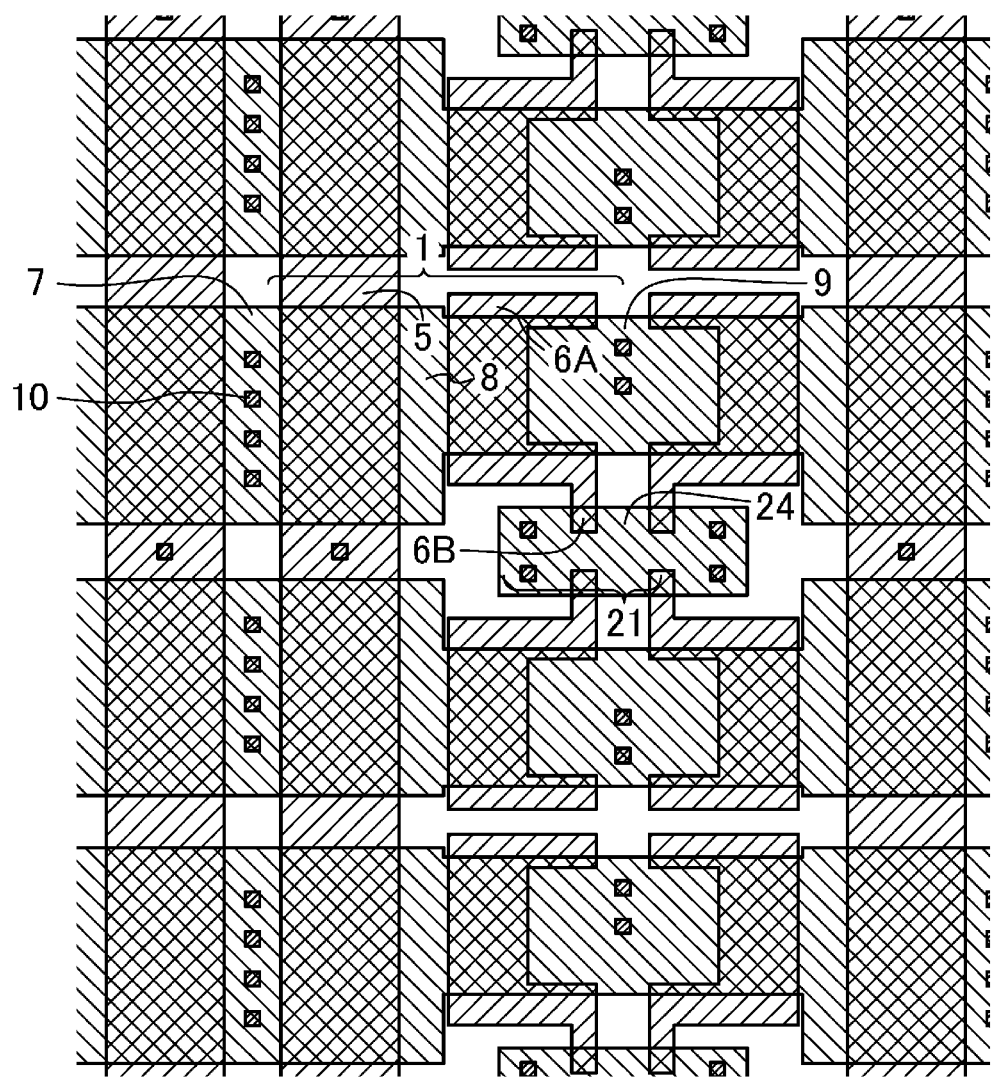
FIG. 20 is a view illustrating a memory array of the semiconductor device of the fifth embodiment.

A configuration example of a memory array using the memory cell of this embodiment is illustrated in FIG. 20. In this configuration, elements 21 of erasing sections of four memory cells are put together in one position and an area of the memory array can be reduced. Also, similar to the first embodiment, a substrate contact region can be set in a portion of the source portion of each of the memory cells.

Sixth Embodiment

Figure 21:
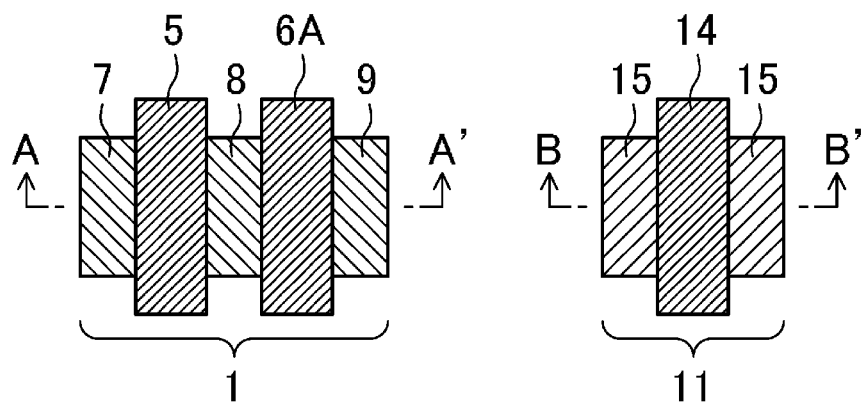
FIG. 21 is a plan view schematically illustrating configurations of a memory cell and another transistor for a semiconductor device of a sixth embodiment.
Figure 22:
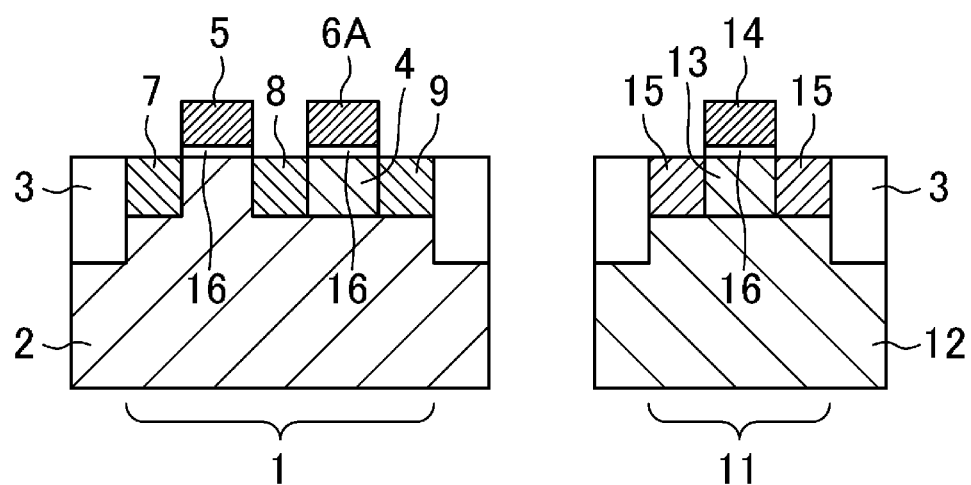
FIG. 22 is a cross-sectional view illustrating cross sections taken along the line A-A' and the line B-B' of FIG. 21.

FIG. 21 is a plan view schematically illustrating a layout for a semiconductor memory device of a sixth embodiment of the present disclosure. FIG. 22 is a cross-sectional view schematically illustrating cross sections taken along the line A-A' and the line B-B' of FIG. 21.

The semiconductor memory device of this embodiment includes a first active region 1, as a memory cell, including a read section and a write section and a second active region 11 including a P-channel type MOS transistor used for a general circuit or the like other than a memory. The memory cell is illustrated as an OTP memory that includes a read section and a write section but does not include an erasing section. However, the memory cell can be made into an MTP memory by adding an erasing section as will be described in another embodiment described later.

In the first active region 1, the memory cell is formed using a P-type well 2 that is a semiconductor substrate. A selection gate 5 and a floating gate 6A are formed on the P-type well 2 divided by an isolation region 3 with a gate insulation film 16 interposed therebetween. A source region 7 is formed in a part of the upper portion of the P-type well 2 located in an opposite side to the floating gate 6A with respect to the selection gate 5. A diffused connection region 8 is formed in a part of the upper portion of the P-type well 2 located between the selection gate 5 and the floating gate 6A. A drain region 9 is formed in a part of the upper portion of the P-type well 2 located in an opposite side to the selection gate 5 with respective to the floating gate 6A. Thus, a configuration in which the N-channel type selection gate 5 and the floating gate 6A are disposed in series in the P-type well 2 is achieved. Furthermore, the semiconductor memory device includes a first injection region 4 into which impurities have been injected in order to control a threshold of a transistor under the floating gate 6A.

In the memory cell, a selection gate transistor including the source region 7, the diffused connection region 8, the selection gate 5 is formed. Also, a floating gate transistor including the diffused connection region 8, the drain region 9, and the floating gate 6A is formed.

Due to the first injection region 4, the floating gate transistor is set to be of a close type to the depletion type, as compared to the selection gate transistor. Thus, the floating gate transistor has a lower threshold than a threshold of the selection gate transistor. As a result, even when an electric charge amount in the floating gate is small, the transistor can be put in an on state. Thus, a reset state, such as an erased state, can be easily achieved, and operation efficiency is increased.

In the second active region 11, a P-channel type MOS transistor is formed using an N-type well 12. A gate 14 is formed on the N-type well 12 divided by the isolation region 3 with a gate insulation film interposed therebetween. An impurity region 15 that is a source region or a drain region is formed in each of parts of the upper portion of the N-type well 12 located in both sides of the gate 14.

Furthermore, a second injection region 13 into which impurities have been injected in order to control a threshold of a P-channel type MOS transistor under the gate 14.

In this embodiment, the first injection region 4 in the first active region 1 is formed using the same injection as that used for the second injection region 13 in the second active region 11. Accordingly, in a process step of forming the second injection region 13, the first injection region 4 can be simultaneously formed, and therefore, the number of process steps, costs, or the like in semiconductor device fabrication can be reduced.

However, when the preferable thresholds are different from each other, or in a like case, proper injection conditions can be set separately for the first injection region 4 and the second injection region 13 to perform separate injections, thereby forming the first injection region 4 and the second injection region 13.

Moreover, when the N-channel type MOS transistor is used for the selection gate transistor and the floating gate transistor that form the memory cell, the N-channel type MOS transistor is set to be a transistor of a closer type to the depletion type, and thus, can be put in an on state without causing over erased state. Thus, erasing efficiency is increased, and therefore, advantageous effects, such as reduction in an erasing voltage, increase in erasing speed, improvement of erasing characteristics due to reduction in stress during erasing, or the like, can be realized. Note that ultraviolet rays or the like can be used for erasing (resetting) of the OTP memory.

Seventh Embodiment

Figure 23:
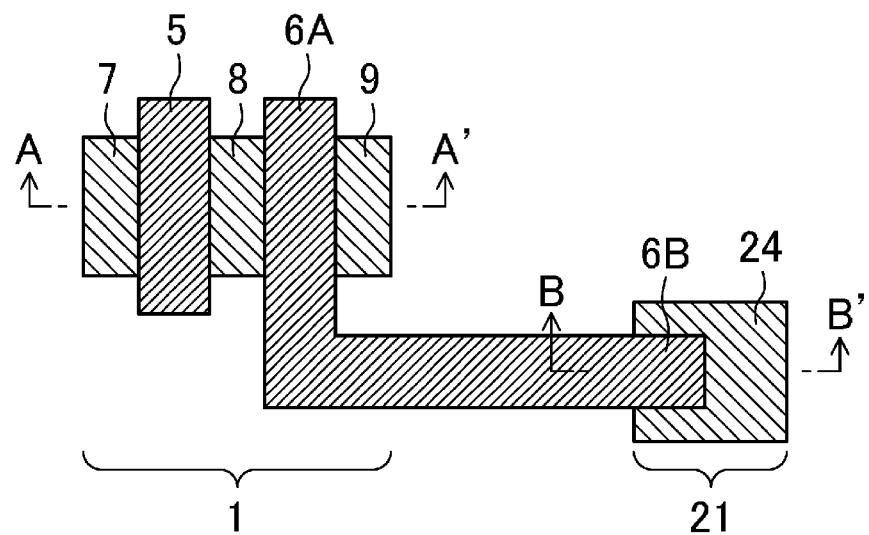
FIG. 23 is a plan view schematically illustrating a configuration of a main portion of a memory cell for each of semiconductor devices of seventh and eighth embodiments.
Figure 24:
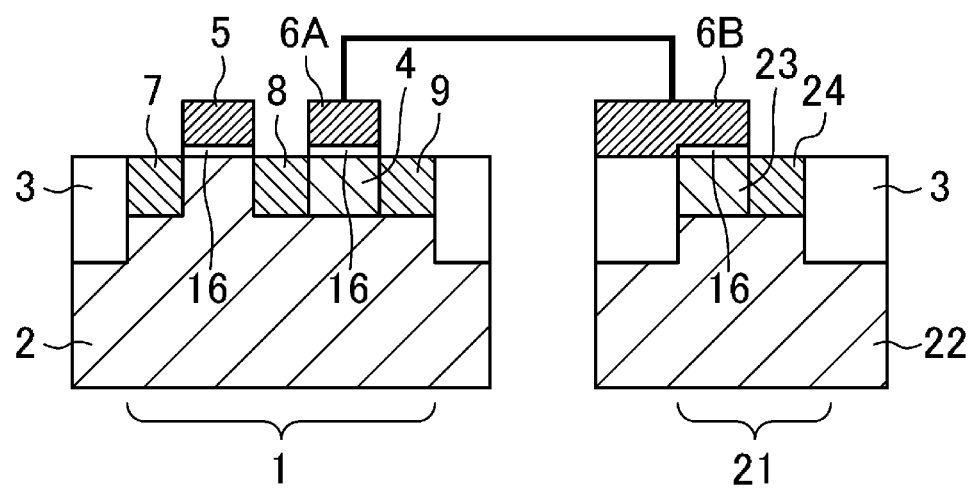
FIG. 24 is a cross-sectional view illustrating cross sections taken along the line A-A' and the line B-B' of FIG. 23 for the semiconductor device of the seventh embodiment.

Next, a seventh embodiment will be described. FIG. 23 is a plan view schematically illustrating a layout for a semiconductor memory device of a seventh embodiment. FIG. 24 is a cross-sectional view schematically illustrating cross sections taken along the line A-A' and the line B-B' of FIG. 23.

The semiconductor memory device of this embodiment includes a first active region 1, as a memory cell, including a read section and a write section and an erasing active region 21 in which a memory erasing operation is performed, and therefore, is an MTP memory.

Specifically, the first active region 1 has a similar configuration to that of the sixth embodiment illustrated in FIG. 21 and FIG. 22. However, as illustrated in FIG. 23, the floating gate 6A is formed so as to extend to the erasing active region 21.

As illustrated in FIG. 24, the erasing active region 21 is formed using a P-type well 22 that is a semiconductor substrate. An extended floating gate 6B is disposed on a portion of the P-type well 22 divided by an isolation region 3 with a gate insulation film 16 interposed therebetween. The floating gate 6B functions as an erasing gate of the memory cell. An erasing section injection region 23 into which impurities have been injected in order to control a threshold of the erasing gate is formed in a part of an upper portion of the P-type well 22 located under the floating gate 6B. An erasing source region 24 is formed in another portion of the P-type well 22.

The semiconductor memory device is set to operate as the depletion type by providing the erasing section injection region 23. Thus, a configuration in which, when a voltage used for erasing is applied, the voltage reliably reaches under a gate can be achieved. Therefore, reduction in an application voltage and reduction in time in erasing can be achieved.

Note that, in this example, for the erasing source region 24, a separate injection from that for the erasing section injection region 23 is performed to form the erasing source region 24. However, when the erasing section injection region 23 is formed by injecting impurities at a sufficiently high concentration, it can be omitted to perform a separate injection to form the erasing source region 24.

In this embodiment, each of the write section and the read section of the memory cell provided in the first active region 1 and the erasing section provided in the erasing active region 21 is formed into an N-channel type structure in the P-type well (the P-type well 2 and the P-type well 22). Therefore, as compared to a configuration in which both of a P-type well and an N-type well are required, an area of the memory cell can be reduced.

Moreover, also in this embodiment, the first injection region 4 into which impurities have been injected in order to control the threshold of the transistor is provided under the floating gate 6A in the first active region 1. Thus, the floating gate transistor is set to be of a closer type to the depletion type, as compared to the selection gate transistor, and can be put in an on state without causing an over erasing state. Thus, the erasing efficiency is increased, and therefore, advantageous effects, such as reduction in an erasing voltage, increase in erasing speed, improvement of erasing characteristics due to reduction in stress during erasing, or the like, can be realized.

Eighth Embodiment

Figure 25:
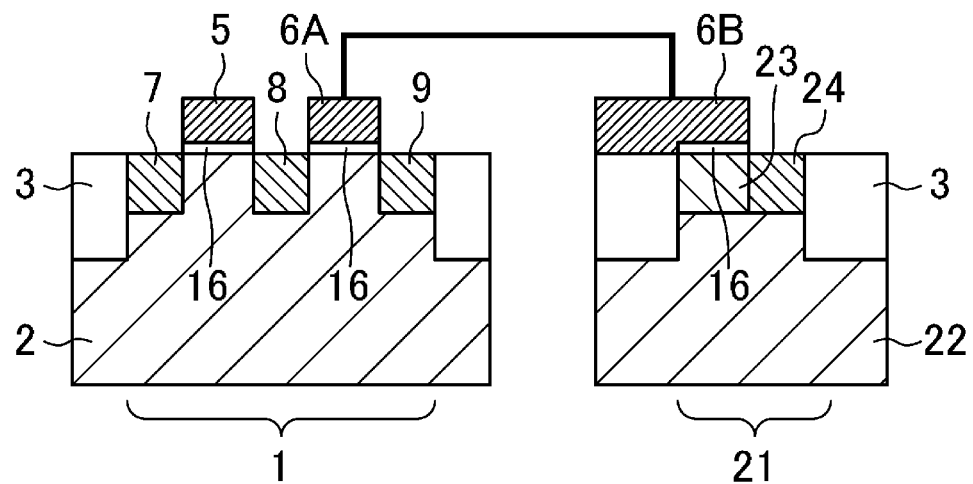
FIG. 25 is a cross-sectional view illustrating cross sections taken along the line A-A' and the line B-B' of FIG. 23 for the semiconductor device of the eighth embodiment.
Figure 26:
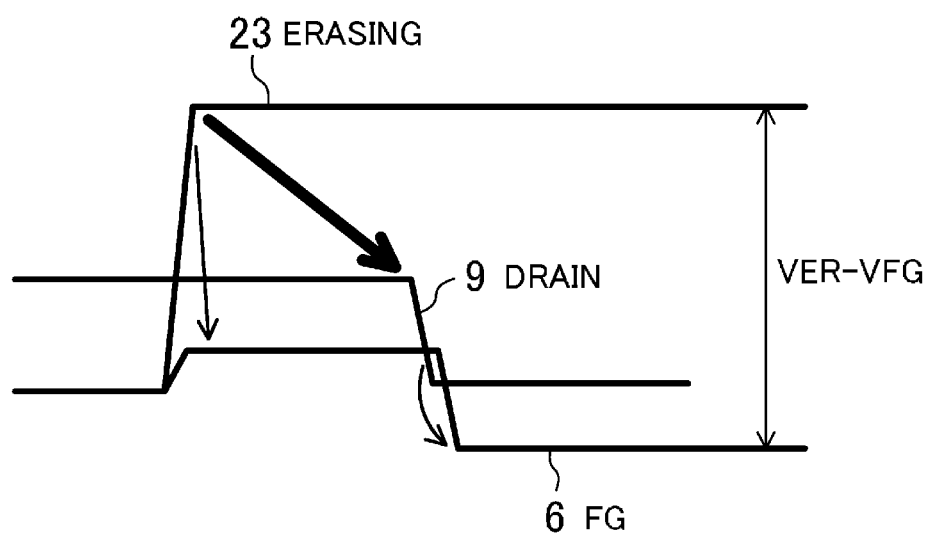
FIG. 26 is a chart illustrating an operation timing of the memory cell for each of the semiconductor devices of the seventh and eighth embodiments.
Figure 27:
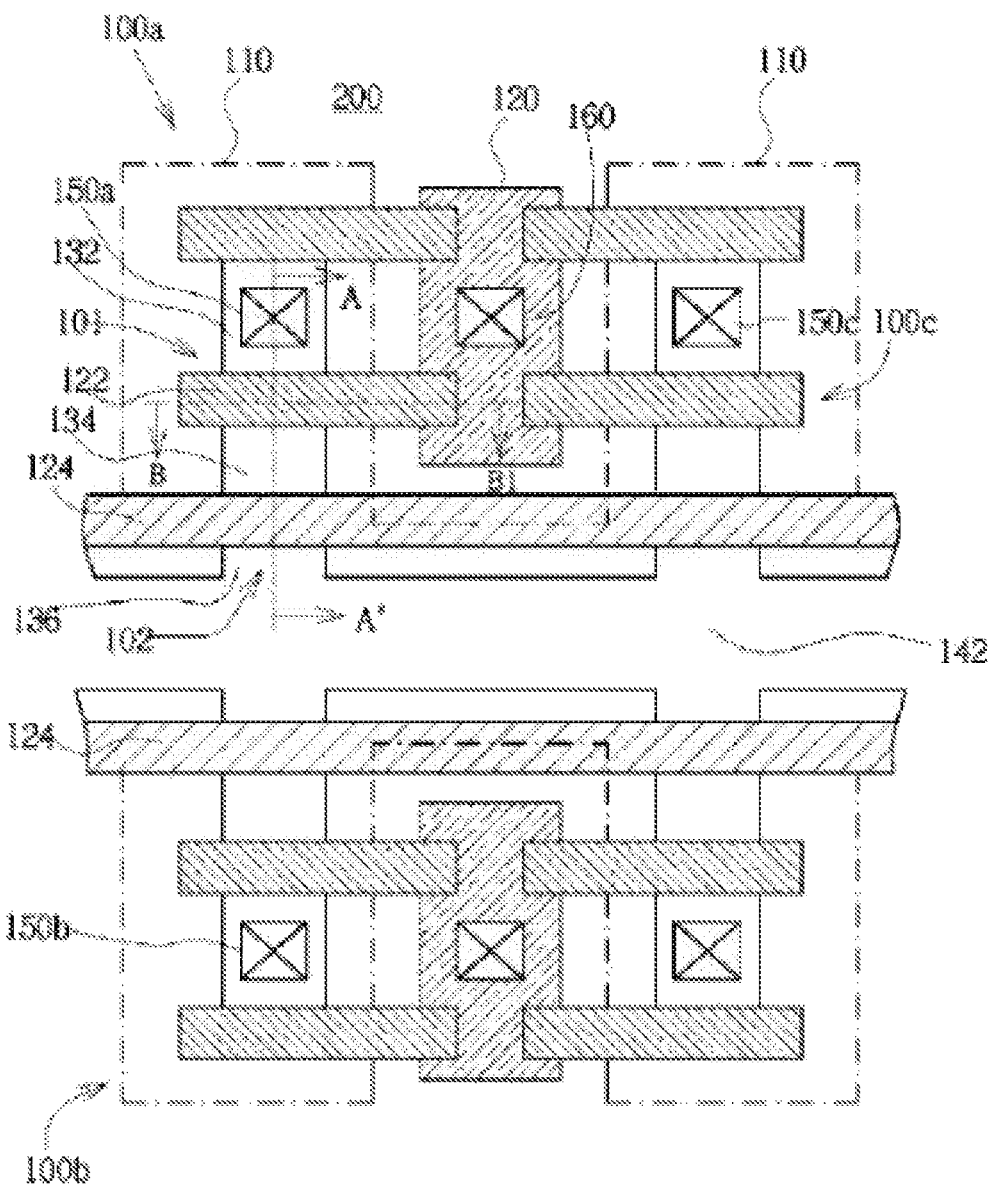
FIG. 27 is a view illustrated in Japanese Unexamined Patent Publication No. 2016-18992

Next, an eighth embodiment will be described. FIG. 23 is a plan view schematically illustrating a layout for a semiconductor memory device of an eighth embodiment. FIG. 25 is a cross-sectional view schematically illustrating cross sections taken along the line A-A' and the line B-B' of FIG. 23.

The semiconductor device of this embodiment is different from the semiconductor device of the seventh embodiment in a point that the semiconductor device does not include the first injection region 4 into which impurities have been injected in order to control the threshold of the transistor. Other than that, the semiconductor device of this embodiment has a similar configuration to that of the semiconductor device of the seventh embodiment.

Accordingly, in the semiconductor device of this embodiment, the floating gate transistor in the first active region 1 is not set to be of a closer type to the depletion type. That is, in this configuration, the threshold is easily set high and, in a write operation, writing using hot electrons is easily performed, so that stress in writing can be reduced. In an erasing operation, erasing is performed with a proper erasing voltage in a proper erasing time such that large over erasing does not occur.

As described above, in the above described case, increase in a performance of the semiconductor device is realized.

Ninth Embodiment

Next, a ninth embodiment will be described. FIG. 6 is a chart illustrating a timing of an operation performed in a memory cell in the semiconductor device of the seventh or eighth embodiment. In this case, it is aimed to set a voltage applied to the gate (the floating gate 6B) in the erasing section and the erasing section injection region 23 under the gate high. However, as the voltage under the gate is set high, a voltage applied between the P-type well 22 and the erasing section injection region 23 is raised and dielectric strength becomes an issue in some cases. Therefore, for the voltage under the gate, a voltage equal to or lower than a dielectric voltage is applied to cause the voltage of the floating gate 6B to be in a negative direction.

First, for example, a high voltage of 8 V is applied to a diffusion layer (the erasing section injection region 23) under the gate in the erasing section. At this time, in the floating gate 6B of the erasing section, the voltage is slightly raised by coupling, and the voltage (VER-VFG) applied between the floating gate 6B and the erasing section injection region 23 is slightly lower than 8V. In this case, when the drain voltage is transitioned in the negative direction, due to coupling of the floating gate 6A of the read section and the write section (the first active region 1), the voltage of the floating gate 6A can be lowered. Thus, the voltage (VER-VFG) applied between the floating gate 6A and the erasing section injection region 23 can be made a higher voltage than 8 V.

As described above, an erasing voltage that is to be applied can be raised, and therefore, reduction in the erasing time or the like is realized.

When performing the above described operation, a channel is formed in a floating gate 6A portion of the read section and the write section by raising a voltage applied to the erasing section injection region 23 under the floating gate 6B in the erasing section. Therefore, when the drain voltage is caused to be in the negative direction, the effect of coupling is increased and the voltage of the floating gate can be further reduced.

A memory cell is configured to operate in the above described operation method, and thus, an operation, such as erasing or the like, can be more efficiently performed.

Note that, in each of the above described embodiments, a configuration in which the active regions are formed in the same well or a configuration in which separate wells in which respective active regions are formed are joint together has been described. However, technical contents of the present disclosure are not limited to the above described embodiments. For example, using a silicon on insulator (SOI) structure in which a box layer that is an insulation layer is formed on the semiconductor device and an active layer is formed thereon, an active region can be formed in the active layer. In an SOI structure, a configuration in which the box layer that is an insulation layer and the isolation region 3 are coupled to each other may be employed. Thus, a lower portion and a side surface portion of each active region are isolated by an insulation film, and thus, are electrically isolated from each other.

In a semiconductor device according to the present disclosure, the operation efficiency of writing, erasing, or the like is increased, and therefore, the semiconductor device is useful as a memory device.

What is claimed is:

1. A semiconductor device, comprising:
a memory cell formed on a semiconductor substrate, wherein
the memory cell includes a first source region and a first drain region that are formed in the semiconductor substrate and a first selection gate and a first floating gate disposed in series between the first source region and the first drain region, and
a first floating gate transistor including the first drain region and the first floating gate has a threshold set lower than a threshold of a first selection gate transistor including the first source region and the first selection gate.

2. The semiconductor device of claim 1, further comprising:
a first element including a first region and a first gate portion each corresponding to an associated one of a source and a drain that are formed in the semiconductor substrate,
wherein
each of the first selection gate transistor and the first floating gate transistor is an N-channel type transistor, and
the first gate portion is electrically coupled to the first floating gate.

3. The semiconductor device of claim 2, wherein the threshold of the first floating gate transistor is lowered by applying a positive voltage to the first region and extracting electric charge of the first floating gate.

4. The semiconductor device of claim 3, wherein the threshold of the first floating gate transistor is lowered by applying a zero voltage or a negative voltage to the first drain region and lowering a potential level of the first floating gate.

5. The semiconductor device of claim 2, wherein the threshold of the first floating gate transistor is raised due to hot carriers by applying a positive voltage to the first drain region and applying a positive voltage to the first region.

6. The semiconductor device of claim 2, further comprising:
a second element including a second region and a second gate portion each corresponding to an associated one of a source and a drain that are formed in the semiconductor substrate,
wherein the second gate portion is electrically coupled to the first floating gate.

7. The semiconductor device of claim 6, wherein
the second gate portion is larger than first gate portion,
the threshold of the first floating gate transistor is lowered by applying a positive voltage to the first region and extracting electric charge of the first floating gate, and
the threshold of the first floating gate transistor is raised due to hot carriers by applying a positive voltage to the first drain region and applying a positive voltage to the second region.

8. The semiconductor device of claim 2, further comprising:
a second drain region formed on the semiconductor substrate; and
a second floating gate disposed between the second drain region and the first selection gate,
wherein
a second floating gate transistor including the second drain region and the second floating gate is formed, and
the first floating gate and the second floating gate are electrically coupled to each other.

9. The semiconductor device of claim 8, wherein
the second floating gate has a smaller width than a width of the first floating gate, and
the threshold of the first floating gate transistor is raised due to hot carriers in the second floating gate transistor by applying a positive voltage to the second drain region.

10. The semiconductor device of claim 2, further comprising:
a second drain region formed on the semiconductor substrate; and
a second floating gate and a second selection gate disposed in series between the second drain region and the first source region,
wherein
a second floating gate transistor including the second drain region and the second floating gate and a second selection gate transistor including the first source region and the second selection gate are formed, and
the first floating gate and the second floating gate are electrically coupled to each other.

11. The semiconductor device of claim 10, wherein
the second floating gate has a smaller width than a width of the first floating gate, and
the threshold of the first floating gate transistor is raised due to hot carriers in the second floating gate transistor by applying a positive voltage to the second drain region.

12. The semiconductor device of claim 1, wherein the first floating gate has a planner shape with a recessed portion in a gate side wall located in a side closer to the first drain region.

13. The semiconductor device of claim 1, wherein a portion of the first source region is a region that can be electrically coupled to the semiconductor substrate.

14. The semiconductor device of claim 1, further comprising: another transistor of an opposite channel type to a channel type of the first floating gate transistor,
wherein a same injection as an injection that is performed to control a threshold in the another transistor is performed also on a channel portion of the first floating gate transistor.

15. A semiconductor device comprising:
a memory cell formed on a semiconductor substrate, wherein
the memory cell includes a source region and a drain region that are formed in a first well of the semiconductor substrate, a selection gate and a floating gate disposed in series between the source region and the drain region, and an erasing active region formed for use in an erasing operation in a first conductive type well of the semiconductor substrate, a gate electrically coupled to the floating gate is disposed on the erasing active region, a second conductive type injection is performed under the gate, and thus, a state of a depletion type is achieved, and an area of a region of the floating gate on the first well is larger than an area of a region of the gate on the first conductive type well.

16. A semiconductor device comprising:

a memory cell formed on a semiconductor substrate, wherein the memory cell includes a source region and a drain region that are formed in a first well in the semiconductor substrate, a selection gate and a floating gate disposed in series between the source region and the drain region, and an erasing active region formed for use in an erasing operation in the first conductive type well of the semiconductor substrate, a gate electrically coupled to the floating gate is disposed on the erasing active region and an area of a region of the floating gate on the first well is larger than an area of a region of the gate on the first conductive type well.

17. The semiconductor device of claim 16, wherein when performing an erasing operation, a voltage of the erasing active region is set to a high voltage, and thereafter, a voltage of the drain region is changed to a low voltage.

18. A method for operating the semiconductor device of claim 16, comprising:

when performing an erasing operation, setting a voltage of the erasing active region to a high voltage, and thereafter, changing a voltage of the drain region to a low voltage.

* * * * *